United States Patent
Rendek, Jr. et al.

(10) Patent No.: US 8,472,207 B2
(45) Date of Patent: Jun. 25, 2013

(54) ELECTRONIC DEVICE HAVING LIQUID CRYSTAL POLYMER SOLDER MASK AND OUTER SEALING LAYERS, AND ASSOCIATED METHODS

(75) Inventors: Louis Joseph Rendek, Jr., West Melbourne, FL (US); Casey Philip Rodriguez, Indialantic, FL (US); Steven R. Snyder, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 204 days.

(21) Appl. No.: 13/007,072

(22) Filed: Jan. 14, 2011

(65) Prior Publication Data

US 2012/0181073 A1 Jul. 19, 2012

(51) Int. Cl.
*H05K 1/18* (2006.01)
(52) U.S. Cl.
USPC ........... 361/762; 361/760; 361/761; 174/256; 174/255; 29/846
(58) Field of Classification Search
USPC .......... 174/255–258, 260–265; 361/760–763, 361/784, 790, 792; 29/830–832, 837, 846
See application file for complete search history.

(56) References Cited

U.S. PATENT DOCUMENTS

| | | | |
|---|---|---|---|
| 5,534,094 A | 7/1996 | Arjavalingam et al. | 156/155 |
| 6,183,588 B1 | 2/2001 | Kelly et al. | 156/247 |
| 6,372,992 B1 | 4/2002 | Yang | 174/117 F |
| 6,998,327 B2 | 2/2006 | Danielson et al. | 438/455 |

(Continued)

FOREIGN PATENT DOCUMENTS

| | | |
|---|---|---|
| EP | 2237652 | 10/2010 |
| JP | 2006310541 | 11/2006 |

OTHER PUBLICATIONS

Culbertson, Edwin C., "A New Laminate Material for High Performance PCBs: Liquid Crystal Polymer Copper Clad Films," IEEE, pp. 520-523, 1995.

(Continued)

*Primary Examiner* — Hoa C Nguyen
(74) *Attorney, Agent, or Firm* — Allen, Dyer, Doppelt, Milbrath & Gilchrist, P.A.

(57) ABSTRACT

An electronic device includes a substrate with a circuit layer thereon that has a solder pad. There is a liquid crystal polymer (LCP) solder mask on the substrate that has an aperture aligned with the solder pad. There is a fused seam between the substrate and the LCP solder mask. Solder is in the aperture, and a circuit component is electrically coupled to the solder pad via the solder. A first dielectric layer stack having a first plurality of dielectric layers is on the LCP solder mask and has an aperture aligned with the solder pad. There is a first LCP outer sealing layer on the first dielectric layer stack, and a second dielectric layer stack having a second plurality of dielectric layers on the substrate on a side thereof opposite the LCP solder mask. Further, there is a second LCP outer sealing layer on the second dielectric layer stack.

19 Claims, 3 Drawing Sheets

U.S. PATENT DOCUMENTS

| | | | |
|---|---|---|---|
| 2004/0035604 A1* | 2/2004 | Takenaka et al. | 174/255 |
| 2005/0016768 A1* | 1/2005 | Zollo et al. | 174/262 |
| 2005/0067686 A1 | 3/2005 | Usui et al. | |
| 2005/0112798 A1 | 5/2005 | Bjorbell | 438/106 |
| 2006/0017152 A1* | 1/2006 | White et al. | 257/700 |
| 2006/0068576 A1 | 3/2006 | Burdick, Jr. et al. | 438/586 |
| 2006/0204733 A1* | 9/2006 | Murai et al. | 428/209 |
| 2006/0213683 A1* | 9/2006 | Myoung et al. | 174/255 |
| 2007/0025092 A1 | 2/2007 | Lee et al. | 361/761 |
| 2008/0023819 A1* | 1/2008 | Chia et al. | 257/692 |
| 2008/0142951 A1* | 6/2008 | Hsu et al. | 257/700 |
| 2009/0084595 A1 | 4/2009 | Park et al. | |
| 2009/0129037 A1 | 5/2009 | Yoshino | |
| 2009/0185357 A1* | 7/2009 | Rendek et al. | 361/762 |
| 2009/0250253 A1 | 10/2009 | Park et al. | |
| 2010/0066683 A1 | 3/2010 | Chang et al. | 345/173 |
| 2010/0149768 A1* | 6/2010 | Takaike | 361/761 |
| 2010/0206621 A1 | 8/2010 | Wada | |
| 2011/0147920 A1* | 6/2011 | Choudhury et al. | 257/712 |
| 2011/0149519 A1* | 6/2011 | Choudhury et al. | 361/707 |
| 2012/0087097 A1* | 4/2012 | Hong et al. | 361/763 |
| 2012/0181073 A1 | 7/2012 | Rendek, Jr. et al. | |

OTHER PUBLICATIONS

Narayan, C., et al., "Thin Film Transfer Process for Low Cost MCM's", IEEE/CHMT Int'l Electronics Manufacturing Technology Symposium, pp. 373-380, 1993.

T. Zhang et al., "The Processing and Assembly of Liquid Crystalline Polymer Printed Circuits," 2002 Int. Symposium on Microelectronics, pp. 1-9, 2002.

Culbertson, Edwin C., "A New Laminate Material for High Performance PCBs: Liquid Crystal Polymer Copper Clad Films," IEEE, 1995.

Narayan, C., et al., "Thin Film Transfer Process for Low Cost MCM's", IEEE/CHMT Int'l Electronics Manufacturing Technology Symposium, 1993.

T. Zhang et al., "The Processing and Assembly of Liquid Crystalline Polymer Printed Circuits," 2002 Int. Symposium on Microelectronics.

T. Zhang, et al., "Flexible Electronics: Thin Silicon Die on Flexible Substrates", IEEE Transactions on Electronics Packaging Manufacturing, vol. 32, No. 4, 291-300 (2009).

* cited by examiner

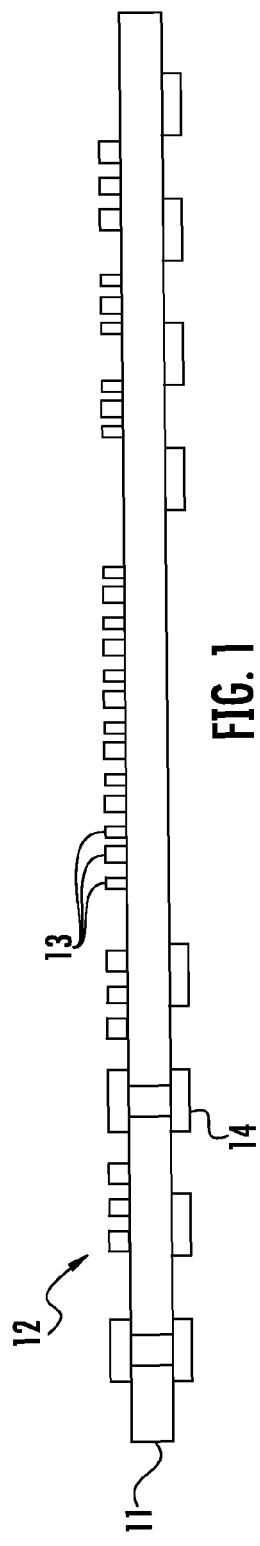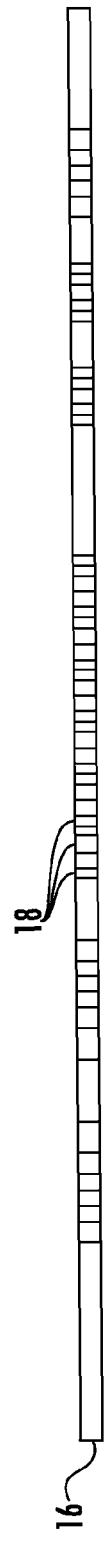

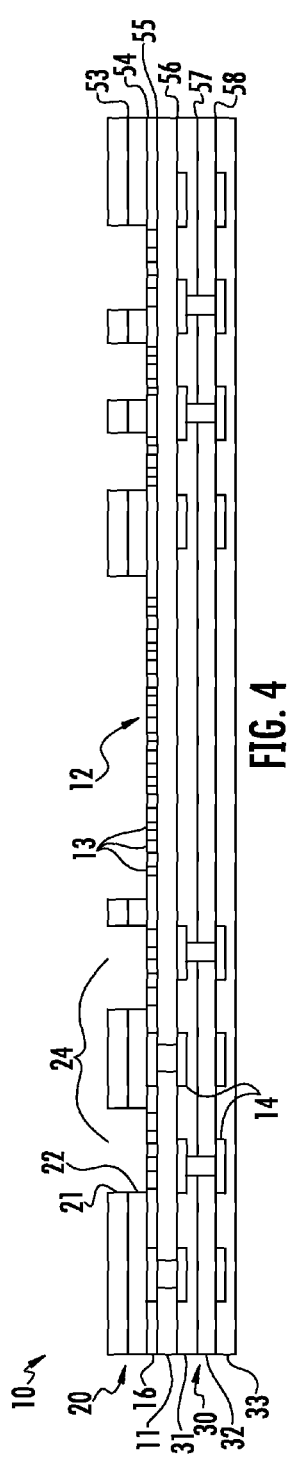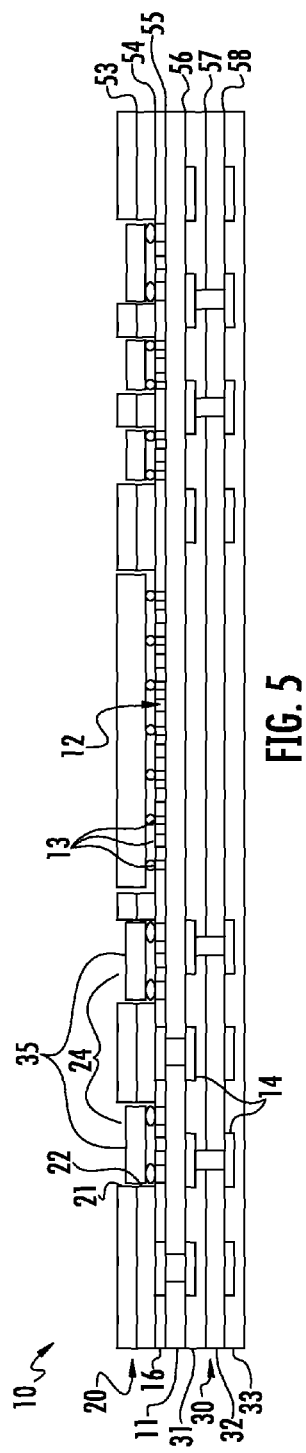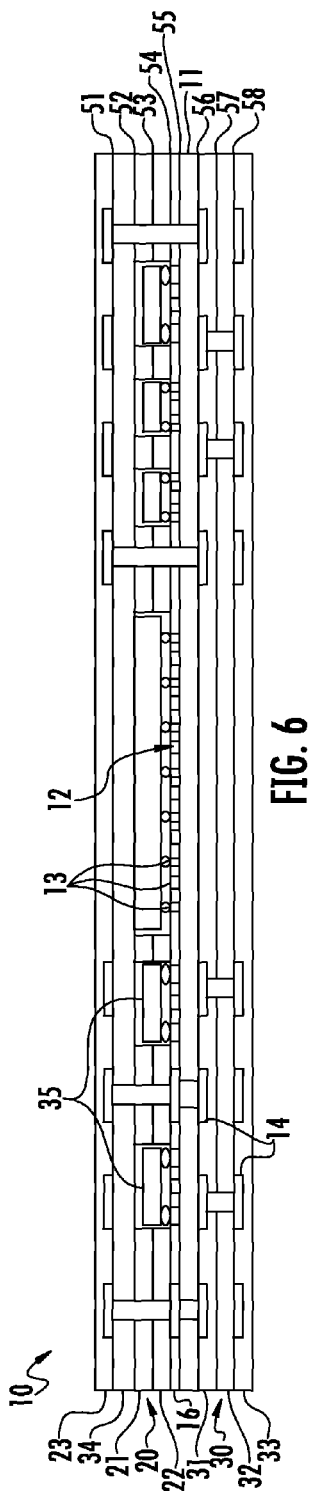

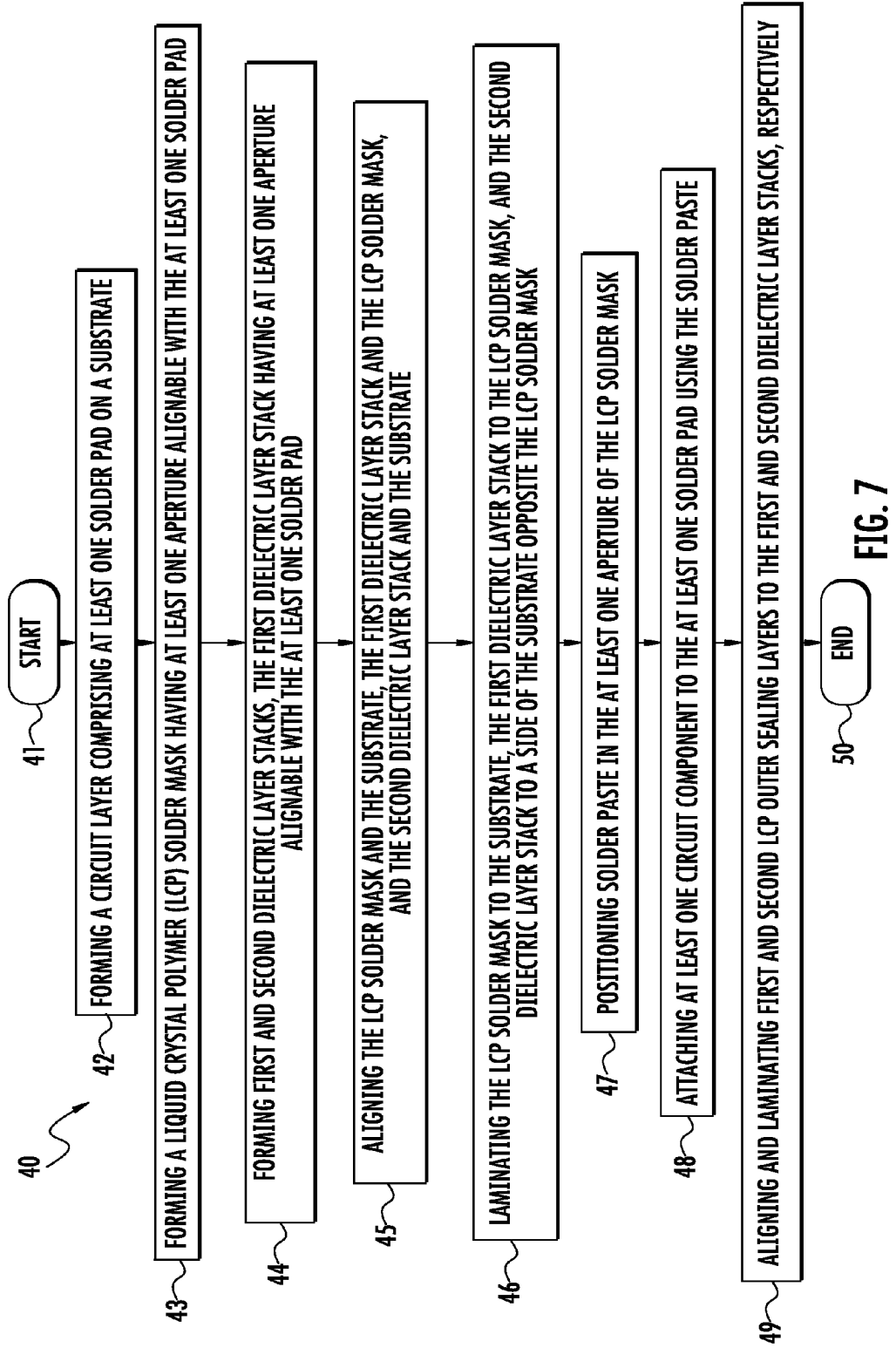

ELECTRONIC DEVICE HAVING LIQUID CRYSTAL POLYMER SOLDER MASK AND OUTER SEALING LAYERS, AND ASSOCIATED METHODS

FIELD OF THE INVENTION

The present invention relates to the field of electronic device fabrication and, more particularly, to an electronic device with a liquid crystal polymer solder mask and a plurality of dielectric layers, as well as related methods.

BACKGROUND OF THE INVENTION

As semiconductor and integrated circuit technology has advanced, there has been a trend toward high-functionality integrated circuit components with numerous input and output pads, together with a demand for reduced chip size, weight, and power consumption. Consequently, as integrated circuits are reduced in size, they increasingly have smaller output pads arranged more closely together than ever before.

To match these high functionality integrated circuits, there is a demand for printed wiring boards consisting of closely arranged pads for solder attach of the integrated circuit. However, the miniaturization of the spacing between integrated circuit pads is currently happening at a greater rate than the miniaturization of solder pads on printed circuit boards, in some applications. In addition, the ability to protect these closely spaced pads with solder masks has not kept up with the reduction in space between pads on the integrated circuit. Without solder mask protection between closely spaced adjacent pads, there exists an increased risk for bridging and electrical shorting during the solder reflow process utilized in attaching integrated circuits to printed wiring boards. Consequently, there is an interconnection technology gap for some modern devices.

To make such devices function, printed wiring boards may have extra routing layers to handle the pads of the integrated circuits, or utilize fan-out packaging. This results in the package size of an integrated circuit being larger than the integrated circuit itself, which may limit system miniaturization. In addition to these desires for miniaturized devices, it is also desirable in some cases to construct these devices from a flexible, and not rigid, substrate.

A prior art miniaturized device is described in U.S. Pat. Pub. 2007/0025092 to Lee et al. This reference discloses an electronic device comprising a plurality of build-up layers defining circuit interconnections and that comprise one or more thin film type of embedded passive devices, at least a cavity formed in the build-up layers. An active device is disposed in the cavity and electrically connected to the circuit interconnections of the build-up layers. The packages have a chip reworkability, an easier thermal management, and a relatively very thin profile. However, these packages are not constructed from flexible materials, and may therefore be unsuitable in some situations. In addition, even thinner packages may be desirable.

One material now being used as a substrate from which to construct thin and flexible printed wiring boards is biaxially-oriented liquid crystal polymer (LOP). The molecules in LCPs have rigid, rod-like shapes, and maintain a crystalline order when in a liquid phase or when heated and melted. *The Processing and Assembly of Liquid Crystalline Polymer Printed Circuits*, T. Zhang, W. Johnson, B. Farrell, and M. St. Lawrence, "The processing and assembly of liquid crystalline polymer printed circuits," 2002 *Int. Symp. on Microelectronics*, 2002. discusses the construction of a printed circuit board using LCP as a substrate. A photoresist is first applied to a copper clad laminate, exposed, and developed to define a desired circuit pattern. The actual circuit is then defined by etching the exposed copper away. Multiple circuit layers are laminated together in a hot press or autoclave to form a multilayer. Holes or vias are created in the substrate via mechanical or laser drilling. A desmearing step is then performed to remove debris from the vias or holes, thereby preparing the LCP material for metal deposition. A metallization step is next performed, and a conventional solder mask is applied to the LCP substrate. Solder is then applied through the conventional solder mask to complete the construction of the LCP printed circuit board.

While this design does allow for the creation of thin, flexible printed circuit boards, it still suffers from the same drawbacks as described above with respect to the attachment of integrated circuits with closely spaced pads thereto. As such, additional methods of connecting integrated circuits to printed circuit boards are needed.

SUMMARY OF THE INVENTION

In view of the foregoing background, it is therefore an object of the present invention to provide a method of effectively attaching an electronic component to a substrate.

This and other objects, features, and advantages in accordance with the present invention are provided by an electronic device comprising a substrate, and a circuit layer on the substrate and comprising at least one solder pad. There is a liquid crystal polymer (LCP) solder mask on the substrate and having at least one aperture aligned with the at least one solder pad. In addition, there is a fused seam between the substrate and the LCP solder mask, and solder in the at least one aperture. Furthermore, at least one circuit component is electrically coupled to the at least one solder pad via the solder.

A first dielectric layer stack comprising a first plurality of dielectric layers is on the LCP solder mask and has at least one aperture aligned with the at least one solder pad. There is a first LCP outer sealing layer on the first dielectric layer stack, and a second dielectric layer stack comprising a second plurality of dielectric layers on the substrate on a side thereof opposite the LCP solder mask. Further, a second LCP outer sealing layer is on the second dielectric layer stack.

This device presents numerous advantages, including but not limited to the fact that it can be thinner than the prior art due to the LCP solder mask, the fact that the electronic component is attached to an array of solder pads having a finer pitch than the prior art, and the fact that the LCP outer sealing layers seal the device, protecting it from contaminants.

The first plurality of dielectric layers may include a first dielectric layer on the LCP solder mask, a first bonding layer on the first dielectric layer, and a second dielectric layer on the first bonding layer. In addition, there may be a fused seam between the first dielectric layer and the LCP solder mask, a fused seam between the bonding layer and the first dielectric layer, a fused seam between the first bonding layer and the second dielectric layer, and a fused seam between the second dielectric layer and the first LCP outer layer.

In some applications, the second plurality of dielectric layers comprises a second bonding layer on the substrate on a side thereof opposite the LCP solder mask, and a third dielectric layer on the second bonding layer. There may be a fused seam between the second bonding layer and the substrate, and a fused seam between the second bonding layer and the third dielectric layer, and a fused seam between the third dielectric layer and the second LCP outer layer.

In some applications, the substrate may be a liquid crystal polymer (LCP) substrate. In addition, the first and second plurality of dielectric layers may each comprise a plurality of LCP dielectric layers. At least one electrically conductive via may be in each of the first plurality of dielectric layers and the second plurality of dielectric layers.

The at least one solder pad may be a plurality thereof may be arranged in an array pattern, and the at least one aperture in the LCP solder mask may be less than 0.10" inches, and in some cases as small as or less than 0.0025 inches.

A method aspect is directed to a method of making an electronic device. The method comprises forming a circuit layer comprising at least one solder pad on a substrate, and forming a liquid crystal polymer (LCP) solder mask having at least one aperture alignable with the at least one solder pad. The method also includes forming first and second dielectric layer stacks, the first dielectric layer stack having at least one aperture alignable with the at least one solder pad, and aligning the LCP solder mask and the substrate, the first dielectric layer stack and the LCP solder mask, and the second dielectric layer stack and the substrate. The method further includes laminating the LCP solder mask to the substrate, the first dielectric layer stack to the LCP solder mask, and the second dielectric layer stack to a side of the substrate opposite the LCP solder mask. Also, the method includes positioning solder paste in the at least one aperture of the LCP solder mask, attaching at least one circuit component to the at least one solder pad using the solder paste, and aligning and laminating first and second LOP outer sealing layers to the first and second dielectric layer stacks, respectively.

BRIEF DESCRIPTION OF THE DRAWINGS

FIGS. 1-6 are sequential schematic cross sectional views during the making of an electronic device of the present invention.

FIG. 7 is a flowchart of a method of making an electronic device according to the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring initially to the flowchart 40 of FIG. 7, together with FIGS. 1-6, a method of making an electronic device 10 is now described. After the start (Block 41), a circuit layer 12 comprising at least one solder pad 13 is formed on a substrate 11 (Block 42), as shown in FIG. 1. Here, the circuit layer 12 illustratively comprises a plurality of solder pads 13 arranged in an array pattern. In addition, electrically conductive vias 14 are formed in the substrate 11, although it should be understood that these vias are optional. Likewise, it should be understood that there may be any number of solder pads 13.

The substrate 11 may be formed from liquid crystal polymer (LCP). LCP is a particularly advantageous material from which to form flexible printed circuit boards for a variety of reasons, including the fact that it has a high tensile strength, providing a high resistance to abrasion and damage. Typically, LCP also has a high mechanical strength at high temperatures, high chemical resistance, inherent flame retardancy, and good weatherability. In addition, LCP is relatively inert. LCP resists stress cracking in the presence of most chemicals at elevated temperatures, including aromatic or halogenated hydrocarbons, strong acids, bases, ketones, and other aggressive industrial substances. Furthermore, LCP can be formed to have a uniform surfaces, thereby allowing narrow gaps between layers.

Those skilled in the art should understand that there are a variety of LCPs that may be used in the production of electronic devices according to the present invention.

Next, a LCP solder mask 16 having at least one aperture 18 alignable with the solder pads 13 is formed (Block 43), as shown in FIG. 2. Forming the solder mask 16 from LCP is advantageous because LCP is resistant to contact with solder, and because LCP is more resistant to chipping than conventional solder masks.

Here, there are illustratively a plurality of apertures 18. The apertures 18 may be formed by suitable processes, such as laser or mechanical drilling/punching. LCP's high abrasion resistance and tensile strength is particularly advantageous when LCP is used as a solder mask 16. The apertures 18 may be as small as 0.004 inches to 0.008 inches, or smaller, for example. In addition, the use of a LCP solder mask 16 does not inhibit flexibility of the electronic device 10 since it is very thin. In addition, a LCP solder mask 16 helps provide a tighter bend radii to the electronic device 10 and will take a permanent shape if heat set. Furthermore, LCP is resistant to a large variety of chemicals and solvents.

Continuing the discussion of the method of making the electronic device 10, first and second dielectric layer stacks 20, 30 are formed (Block 44), as shown in FIGS. 3-4. The first dielectric layer stack 20 has apertures 24 formed therein that align with the solder pads 13, such that electronic components coupled to the solder pads fit in the apertures 24.

In some applications, the substrate 11, the first dielectric layer stack 20, and the second dielectric layer stack 30 may all be formed from LCP. By constructing the substrate 11, solder mask 16, first dielectric layer stack 20, and second dielectric layer stack 30 from LCP, lamination may be performed without the use of adhesive, reducing the total thickness of the resulting device. In addition, by constructing the various layers from LCP, they may be matched (e.g. have a same dielectric constant, loss tangent, coefficient of thermal expansion, etc.), making such an arrangement particularly useful for the construction of dimensionally-stable radio-frequency (RF) devices. In addition, the use of LCP to construct the solder mask 16 results in a solder mask that is thinner than some prior art solder masks, for example 0.001 inch thick as opposed to 0.002+ inches thick. Further, the LCP solder mask 16 exhibits a superior thickness uniformity as compared to some prior art solder masks. Moreover, the LCP solder mask 16 provides a better electrical isolation than conventional solder masks, having a dielectric strength of approximately 3500 volts per mil, as opposed to the 500 volts per mil of the conventional solder masks. Equally important is that the LCP solder mask has apertures that are formed prior to lamination to the underlying substrate which allows for non-solder mask defined pad arrays.

Of course, in some applications, not all layers are constructed from LCP. For example, in an embodiment, the first dielectric layer stack 20 comprises a stacked arrangement of a first dielectric layer 22, a first bonding layer 21, and a second dielectric layer 34. The second dielectric layer stack 30 comprises a stacked arrangement of a second bonding layer 31 and a third dielectric layer 32. The first, second, and third dielectric layers 22, 30, 32 may be constructed from suitable dielectric material, such as polyimide, and the first and second bonding layers 21, 31 may be constructed from any suitable material, such as a pre-impregnated b-stage resin-based material or a thermoplastic bonding film.

Next, the LCP solder mask 16 is aligned with the substrate 11, the first dielectric layer stack 20 is aligned with the LOP solder mask, and the second dielectric layer stack 30 is aligned with the substrate (Block 45), as shown in FIG. 4.

With respect to the LCP solder mask 16 and the substrate 11, as well as the first dielectric layer stack 20 and the LCP solder mask 16, alignment is defined as having the solder pads 13 centered in the middle of the apertures 18. This alignment may be performed by first using a fixture or guide to roughly align the LCP solder mask 16 and the LCP substrate 11, or the first dielectric layer stack 20 and the LCP solder mask, for example, and then finely adjusting the alignment under a microscope to reach the final alignment. This method advantageously allows a positional accuracy of alignment in the range of 0.0005 inches to 0.001 inches.

After the aligning, lamination is performed. That is, the LCP solder mask 16 is laminated to the substrate 11, the first dielectric layer stack 20 is laminated to the LCP solder mask, and the second dielectric layer stack 30 is laminated to a side of the substrate opposite the LCP solder mask (Block 46), as shown in FIG. 4. The lamination is typically performed via the application of heat and pressure, such as in an autoclave. An autoclave advantageously provides isostatic pressure (i.e. equal pressure from all directions), and helps to keep the LCP from deforming during the lamination process. While the use of an autoclave for lamination is preferred, a press (possible in an inert atmosphere) may also be used to perform the lamination. The lamination produces fused seams between adjacent layers, which are readily visible in a photograph of a cross sectioned device.

After lamination, solder paste is positioned in the apertures 18 of the solder mask (Block 47). An electronic component, such as an integrated circuit 35 is then attached to the solder pads 13 by heating the solder paste, which then melts and re-solidifies (Block 48), as shown in FIG. 5.

First and second LCP outer sealing layers 23, 33 are then aligned with the first and second dielectric layer stacks 20, 30, respectively, and laminated thereto (Block 49), as shown in FIG. 6. This seals the device 10, potentially even hermetically sealing it in some applications, helping protect the circuit layer 12 from oxidation when the device 10 is exposed to hostile environments.

It should be understood that instead of a LCP solder mask 16, a LCP coverlay may be used. A coverlay may advantageously provide electrical insulation, and may add a resistance to flexing of the electronic device 10 in some applications.

The completed electronic device 10 is shown in FIG. 6, and comprises a substrate 11, with a circuit layer 12 on the substrate. The circuit layer 12 comprises an array of solder pads 13. There is a LCP solder mask 16 on the substrate 11, having apertures 18 aligned with the solder pads 13. Solder is in the apertures 18 to electrically couple the solder pads 13 to electronic devices 35. A first dielectric layer 20 is on the LCP mask 16, and has apertures 24 therein aligned with the solder pads 13. The first dielectric layer 20 comprises a stacked arrangement of a first dielectric layer 22, a first bonding layer 21, and a second dielectric layer 34. There is a first LCP outer sealing layer 23 on the second dielectric layer 34.

A second dielectric layer stack 30 is on the substrate 11 on a side thereof opposite the LCP solder mask 16. The second dielectric layer stack 30 comprises, in a stacked arrangement, a second bonding layer 31 and a third dielectric layer 32. There is a second LCP outer sealing layer 33 on the third dielectric layer 32. Fused seams 51-58 are between the various layers, and are readily visible in a cross section of the electronic device 10.

Other details of methods for making an electronic device 10 may be found in co-pending applications METHOD OF TRANSFERRING AND ELECTRICALLY JOINING A HIGH DENSITY MULTILEVEL THIN FILM TO A CIRCUITIZED AND FLEXIBLE ORGANIC SUBSTRATE AND ASSOCIATED DEVICES, Ser. No. 13/006,973 and METHOD OF MAKING AN ELECTRONIC DEVICE HAVING A LIQUID CRYSTAL POLYMER SOLDER MASK AND RELATED DEVICES, Ser. No. 13/007,003 and, METHOD OF MAKING AN ELECTRONIC DEVICE HAVING A LIQUID CRYSTAL POLMER SOLDER MASK LAMINATED TO AN INTERCONNECT LAYER STACK AND RELATED DEVICES, Ser. No. 13/007,035, the entire disclosures of which are hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
a substrate;
a circuit layer on said substrate and comprising at least one solder pad;
a liquid crystal polymer (LCP) solder mask on said substrate and having at least one aperture aligned with said at least one solder pad;
a fused seam between said substrate and said LCP solder mask;
solder in the at least one aperture;
at least one circuit component electrically coupled to said at least one solder pad via said solder;
a first dielectric layer stack comprising a first plurality of dielectric layers on said LCP solder mask and having at least one aperture aligned with said at least one solder pad;
a first LCP outer sealing layer on said first dielectric layer stack;
a second dielectric layer stack comprising a second plurality of dielectric layers on said substrate on a side thereof opposite said LCP solder mask; and
a second LCP outer sealing layer on said second dielectric layer stack.

2. The electronic device of claim 1, wherein said first plurality of dielectric layers comprises a first dielectric layer on said LCP solder mask, a first bonding layer on said first dielectric layer, and a second dielectric layer on said first bonding layer.

3. The electronic device of claim 2, further comprising a fused seam between said first dielectric layer and said LCP solder mask, a fused seam between said bonding layer and said first dielectric layer, a fused seam between said first bonding layer and said second dielectric layer, and a fused seam between said second dielectric layer and said first LCP outer layer.

4. The electronic device of claim 1, wherein said second plurality of dielectric layers comprises a second bonding layer on said substrate on a side thereof opposite said LCP solder mask, and a third dielectric layer on said second bonding layer.

5. The electronic device of claim 4, further comprising a fused seam between said second bonding layer and said substrate, and a fused seam between said second bonding layer and said third dielectric layer, and a fused seam between said third dielectric layer and said second LCP outer layer.

6. The electronic device of claim 1, wherein said substrate comprises a liquid crystal polymer (LCP) substrate.

7. The electronic device of claim 1, wherein said first and second plurality of dielectric layers each comprises a plurality of LCP dielectric layers.

8. The electronic device of claim 1, further comprising at least one electrically conductive via in each of said first plurality of dielectric layers and said second plurality of dielectric layers.

9. The electronic device of claim 1, wherein said at least one solder pad comprises a plurality thereof arranged in an array pattern.

10. An electronic device comprising:
a liquid crystal polymer (LCP) substrate;
a circuit layer on said LCP substrate and comprising at least one solder pad;
a LCP solder mask on said LCP substrate and having at least one aperture aligned with said at least one solder pad;
a fused seam between said LCP substrate and said LCP solder mask;
solder in the at least one aperture;
at least one circuit component electrically coupled to said at least one solder pad via said solder;
a first LCP dielectric layer stack comprising a first plurality of dielectric layers on said LCP solder mask and having at least one aperture aligned with said at least one solder pad;
a first LCP outer sealing layer on said first dielectric layer stack;
a second LCP dielectric layer stack comprising a second plurality of dielectric layers on said LCP substrate on a side thereof opposite said LCP solder mask; and
a second LCP outer sealing layer on said second dielectric layer stack.

11. The electronic device of claim 10, further comprising at least one electrically conductive via in each of said first plurality of dielectric layers and said second plurality of dielectric layers.

12. The electronic device of claim 10, wherein said at least one solder pad comprises a plurality thereof arranged in an array pattern.

13. A method of making an electronic device comprising:
forming a circuit layer comprising at least one solder pad on a substrate;
forming a liquid crystal polymer (LCP) solder mask having at least one aperture alignable with the at least one solder pad;
forming first and second dielectric layer stacks, the first dielectric layer stack comprising a first plurality of dielectric layers on the LCP solder mask and having at least one aperture alignable with the at least one solder pad, the second dielectric layer stack comprising a second plurality of dielectric layers on the substrate on a side thereof opposite the LCP solder mask;
aligning the LCP solder mask and the substrate, the first dielectric layer stack and the LCP solder mask, and the second dielectric layer stack and the substrate;
laminating the LCP solder mask to the substrate, the first dielectric layer stack to the LCP solder mask, and the second dielectric layer stack to a side of the substrate opposite the LCP solder mask;
positioning solder paste in the at least one aperture of the LCP solder mask;
attaching at least one circuit component to the at least one solder pad using the solder paste; and
aligning and laminating first and second LCP outer sealing layers to the first and second dielectric layer stacks, respectively.

14. The method of claim 13, wherein the first and second dielectric layer stacks are each formed to have at least one electrically conductive via therein.

15. The method of claim 13, wherein the first dielectric layer stack comprises a first dielectric layer on the LCP solder mask, a first bonding layer on the first dielectric layer, and a second dielectric layer on the first bonding layer; and further comprising laminating the first dielectric layer, the first bonding layer, and the second dielectric layer together.

16. The method of claim 13, wherein the second dielectric layer stack comprises a second bonding layer on the substrate on a side thereof opposite the LCP solder mask, and a third dielectric layer on the second bonding layer; and further comprising laminating the second bonding layer and the third dielectric layer together.

17. The method of claim 13, wherein the substrate comprises a liquid crystal polymer (LCP) substrate.

18. The method of claim 13, wherein the laminating of the LCP solder mask to the substrate, the laminating the first dielectric layer to the LCP solder mask, and the laminating of the second dielectric layer to the side of the substrate opposite the LCP solder mask is performed by applying heat and pressure.

19. The method of claim 13, wherein the first and second dielectric layer stacks each comprise a plurality of LCP dielectric layers.

* * * * *